United States Patent
Wang et al.

(10) Patent No.: US 7,109,105 B2
(45) Date of Patent: Sep. 19, 2006

(54) METHODS OF MAKING SEMICONDUCTOR FUSES

(75) Inventors: Zhongze Wang, Boise, ID (US); Michael P. Violette, Boise, ID (US); Jigish Trivedi, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 121 days.

(21) Appl. No.: 10/838,587

(22) Filed: May 4, 2004

(65) Prior Publication Data

US 2004/0209404 A1 Oct. 21, 2004

Related U.S. Application Data

(60) Division of application No. 10/620,054, filed on Jul. 14, 2003, now Pat. No. 6,927,473, which is a division of application No. 10/331,033, filed on Dec. 27, 2002, now Pat. No. 6,703,263, which is a continuation of application No. 09/901,761, filed on Jul. 9, 2001, now Pat. No. 6,511,868, which is a continuation of application No. 09/165,754, filed on Oct. 2, 1998, now Pat. No. 6,277,674.

(51) Int. Cl.
   H01L 21/8234  (2006.01)
   H01L 21/44    (2006.01)
(52) U.S. Cl. .................... 438/601; 438/333
(58) Field of Classification Search ........ 438/333, 438/601
   See application file for complete search history.

(56) References Cited

U.S. PATENT DOCUMENTS

| | | | |
|---|---|---|---|
| 4,491,860 A | 1/1985 | Lim | |
| 4,740,485 A | 4/1988 | Sharpe-Geisler | |
| 4,783,424 A | 11/1988 | Ohno et al. | |
| 4,796,075 A | 1/1989 | Whitten | |
| 5,589,706 A | 12/1996 | Mitwalsky et al. | |
| 5,618,750 A | 4/1997 | Fujuhara et al. | |
| 5,625,218 A | 4/1997 | Yamadera et al. | |
| 5,914,524 A * | 6/1999 | Komenaka | 257/529 |
| 5,990,537 A * | 11/1999 | Endo et al. | 257/529 |
| 6,008,523 A * | 12/1999 | Narayan et al. | 257/529 |
| 6,163,062 A | 12/2000 | Shiratake et al. | |
| 6,261,937 B1 | 7/2001 | Tobben et al. | |
| 6,277,674 B1 | 8/2001 | Wang et al. | |

OTHER PUBLICATIONS

Fukuda, Yukio, et al., *A New Fusible-Type Programmable Element Composed of Aluminum and Polysilicon.* IEEE Transactions on Electron Devices, vol. ED-33, No. 2, Feb. 1986.

* cited by examiner

*Primary Examiner*—Zandra V. Smith
*Assistant Examiner*—Pamela E Perkins
(74) *Attorney, Agent, or Firm*—TraskBritt

(57) ABSTRACT

Fuses for integrated circuits and semiconductor devices and methods for using the same. The semiconductor fuse contains two conductive layers, an overlying and underlying refractory metal nitride layer, on an insulating substrate. The semiconductor fuse may be fabricated during manufacture of a local interconnect structure including the same materials. The fuse, which may be used to program redundant circuitry, may be blown by electrical current rather than laser beams, thus allowing the fuse width to be smaller than prior art fuses blown by laser beams. The fuse may also be blown by less electrical current than the current required to blow conventional polysilicon fuses having similar dimensions.

19 Claims, 4 Drawing Sheets

METHODS OF MAKING SEMICONDUCTOR FUSES

CROSS-REFERENCE TO RELATED APPLICATIONS

This application is a divisional of application Ser. No. 10/620,054, filed Jul. 14, 2003, now U.S. Pat. No. 6,927,473, issued Aug. 9, 2005, which is a divisional of application Ser. No. 10/331,033, filed Dec. 27, 2002, now U.S. Pat. No. 6,703,263 issued Mar. 9, 2004, which is a continuation of application Ser. No. 09/901,761, filed Jul. 9, 2001, now U.S. Pat. No. 6,511,868, issued Jan. 28, 2003, which is a continuation of application Ser. No. 09/165,754, filed Oct. 2, 1998, now U.S. Pat. No. 6,277,674, issued Aug. 21, 2001.

BACKGROUND OF THE INVENTION

The present invention relates generally to integrated circuit design and fabrication. Specifically, the present invention relates to semiconductor fuses, methods for fabricating the semiconductor fuses, methods for using the semiconductor fuses, and semiconductor devices containing the semiconductor fuses.

Computers typically have various types of devices which store data, such as memory devices. One type of memory device is a read only memory (ROM) device in which data is permanently stored and cannot be overwritten or otherwise altered. Thus, ROM devices are useful whenever unalterable data or instructions are required. ROM devices are also non-volatile devices, meaning that the data is not destroyed when power is shut off. ROM devices are typically programmed during fabrication by making permanent electrical connections in selected portions of the memory device. One disadvantage of ROM devices is that their programming is permanently determined during fabrication and, therefore, can only be changed by redesign.

Another type of memory device is a programmable read only memory (PROM) device. Unlike ROM devices, PROM devices are programmable after their design and fabrication. To render them programmable, PROM devices are typically provided with an electrical connection in the form of a fusible link (fuse). There are a considerable number of fuse designs used in PROM devices, such as those disclosed in IEEE Transactions on Electron Devices, Vol. 33, No. 2, p. 250–253 (February 1986), and in U.S. Pat. Nos. 5,589,706, 4,491,860, 5,625,218, 4,796,075, and 4,740,485, the disclosures of each of which are incorporated herein by reference. Perhaps the most common fuse design is a metal or polysilicon layer which is narrowed or "necked down" in one region. To blow the fuse, a relatively high electrical current is driven though the metal or polysilicon layer. The current heats the metal or polysilicon above its melting point, thereby breaking the conductive link and making the metal layer or polysilicon discontinuous. Usually, the conductive link breaks in the narrowed region because the current density (and temperature) is highest in that region. The PROM device is thus programmed to conducting and non-conducting patterns, thereby forming the 1 or 0 comprising the data stored in the memory device.

Rather than employing an electrical current, a laser can be employed to blow the fuses. Using lasers instead of electrical current to blow fuses, however, has become more difficult as the size of memory devices decreases. As memory devices decrease in size and the degree of integration increases, the critical dimensions (e.g., fuse pitch) of memory cells become smaller. The availability of lasers suitable to blow the fuse becomes limited since the diameter of the laser beam should not be smaller than the fuse pitch. Thus, the fuse pitch, and the size of memory devices, becomes dictated by the minimum diameter of laser beams obtainable by current laser technology.

The ability of electrical currents to blow fuses could aid in adapting fuses for a variety of applications, such as redundancy technology. Redundancy technology improves the fabrication yield of high-density memory devices, such as SRAM and DRAM devices, by replacing failed memory cells with spare ones using redundant circuitry, which is activated by blowing fuses. Using laser beams to blow the fuses limits the size and, therefore, the number of memory devices as explained above since the diameter of a conventional laser beam is about 5 microns. Using electrical currents instead to blow fuses, therefore, has a greater potential for high-degree integration and decreased size of memory devices.

BRIEF SUMMARY OF THE INVENTION

The present invention generally provides fuses for integrated circuits and semiconductor devices, methods for making the same, methods of using the same, and semiconductor devices containing the same. The semiconductor fuse of the present invention contains two conductive layers, an overlying layer and an underlying layer, disposed on an insulating substrate. The underlying layer comprises a refractory metal nitride, such as titanium nitride, and the overlying layer comprises tungsten silicide. The semiconductor fuse may be fabricated during manufacture of local interconnect structures including the same materials.

The present invention includes a semiconductor fuse comprising an insulating substrate, a titanium nitride layer disposed over the insulating substrate, and a tungsten silicide layer disposed over the titanium nitride layer. The insulating substrate may be an isolation region disposed on a silicon or other semiconductor substrate. The titanium nitride layer and the tungsten silicide layer may have a similar pattern, which includes a neck portion located between terminal portions. The neck portion may be smaller in width than the terminal portions and may have a width of about 0.35 microns and length of about 3.5 microns. The inventive semiconductor fuse may be contained in an integrated circuit, either alone or with a local interconnect structure.

The present invention also includes a method of making a semiconductor fuse by providing an insulating substrate, forming a titanium nitride layer over the insulating substrate, and forming a tungsten silicide layer over the titanium nitride layer. The insulating substrate may be a field oxide region formed by thermally oxidizing a portion of a silicon substrate. The titanium nitride layer may be formed by depositing a layer of titanium and annealing the titanium in an atmosphere containing nitrogen or by depositing a layer of titanium in an atmosphere containing nitrogen. The tungsten silicide layer may be formed by chemical vapor deposition. The tungsten silicide layer may be patterned by a photolithographic pattern and etch process and the titanium nitride layer may then be patterned by a wet etch process using the patterned tungsten silicide layer as a hard mask. The method for making the semiconductor fuse can be incorporated into a method for making an integrated circuit containing the fuse alone or containing the fuse and a local interconnect structure.

The present invention also includes a method of using a semiconductor fuse by first providing a semiconductor fuse comprising a tungsten silicide layer and a titanium nitride layer disposed on an insulating substrate and having a neck portion located between terminal portions and then flowing sufficient electrical current to blow the fuse by causing the neck portion of the tungsten silicide layer to melt. When the neck portion has a width of about 0.35 microns and a length of about 3.5 microns, the electrical current sufficient to blow the fuse is about 5.5 mA and the leakage current of the blown fuse is about 1 nA.

By fabricating the semiconductor fuse with tungsten silicide and titanium nitride over an insulating substrate, the fuse of the present invention can be manufactured while also fabricating a local interconnect structure with the same materials. The inventive semiconductor fuse, which is used to program redundant circuitry, can be blown by electrical current rather than laser beams, thus allowing the fuse pitch to be smaller than the pitch of prior art fuses which are blown by laser beams. Another advantage of the inventive semiconductor fuse is that the fuse may be blown by less electrical current, on the order of less than half of the current required to blow conventional polysilicon fuses.

BRIEF DESCRIPTION OF THE SEVERAL VIEWS OF THE DRAWINGS

The figures presented in conjunction with this description are not actual views of any particular portion of an actual semiconductor device or component, but are merely representations employed to more clearly and fully depict the present invention.

DETAILED DESCRIPTION OF THE INVENTION

The following description provides specific details, such as material thicknesses and types, in order to provide a thorough understanding of the present invention. The skilled artisan, however, would understand that the present invention may be practiced without employing these specific details. Indeed, the present invention can be practiced in conjunction with fabrication techniques conventionally used in the industry.

The process steps and structures described below do not form a complete process flow for manufacturing integrated circuit (IC) devices or a completed device. Only the process steps and structures necessary to understand the present invention are described below.

FIGS. 1–7 illustrate the steps of one exemplary method for forming a semiconductor fuse according to the present invention and the resulting structures. As illustrated, the inventive semiconductor fuse can be formed simultaneously with, and integrated with, the process of forming an IC device containing a local interconnect (LI) structure. It will be understood, however, by those skilled in the art that other semiconductor fuses and/or ICs could be formed by slight modifications of the illustrated method.

Figure 1:
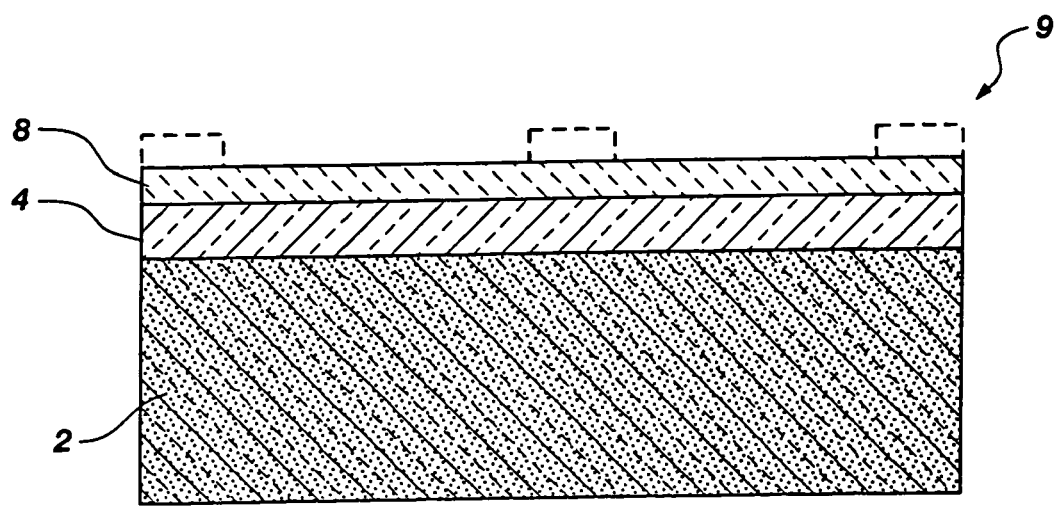
FIGS. 1–5 and 7 are cross-sectional side views of steps of one exemplary process for making fuses according to the present invention, and the resulting fuse.

As shown in FIG. 1, substrate 2 is first provided. Substrate 2 may comprise any surface suitable for device formation, such as a semiconductor wafer, and may be doped and/or include an epitaxial layer. Preferably, substrate 2 is a silicon wafer or bulk silicon region, such as a silicon-on-insulator or silicon-on-sapphire structure. More preferably, substrate 2 is a silicon wafer that has been lightly doped with a p-type dopant, such as boron, to a concentration of about $1\times10^{15}$ to about $1\times10^{17}$ atoms/cm$^3$.

Pad oxide layer 4, which acts as a stress relief layer, is then formed over the upper surface of substrate 2 by any suitable process known in the art. Pad oxide layer 4 may be thermally grown or deposited by any suitable process known in the art, such as chemical vapor deposition (CVD) to a thickness of about 50 to about 200 angstroms. Preferably, pad oxide layer 4 comprises silicon oxide formed by thermal oxidation of the preferred silicon substrate 2.

Silicon nitride layer 8 may then be deposited over pad oxide layer 4. Any suitable process known in the art, such as a CVD process, can be employed to deposit silicon nitride layer 8 to a thickness ranging from about 50 to about 2000 Å. As explained below, silicon nitride layer 8 serves as a mask when forming isolation regions 10 (FIG. 2).

Figure 2:
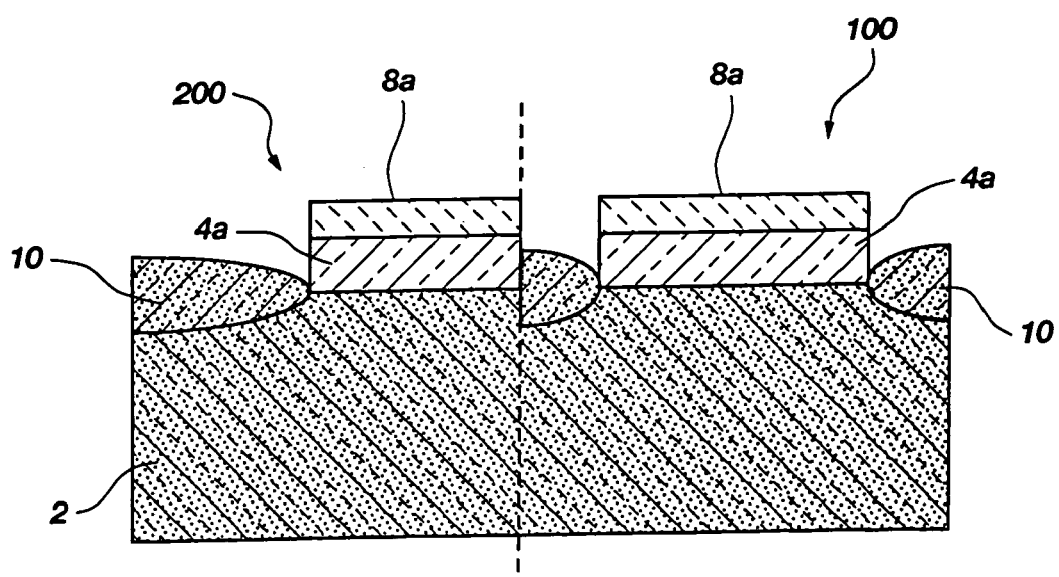

Next, as shown in FIG. 2, silicon nitride layer 8 and pad oxide layer 4 are patterned by any suitable process known in the art, thereby removing undesired portions of silicon nitride layer 8 and pad oxide layer 4 above portions of substrate 2 where field isolation regions 10 will be formed and leaving silicon nitride layer 8a and pad oxide layer 4a. The structure in FIG. 2 is illustrated in two portions, portion 200 including the to-be-formed fuse and portion 100 including the to-be-formed local interconnect structure, separated by the vertical dotted line. Any suitable patterning process known in the art, such as a photolithographic pattern and etch process, can be used to pattern silicon nitride layer 8 and pad oxide layer 4. For example, a photoresist film can be spun on silicon nitride layer 8, developed, and portions thereof removed to leave photoresist mask 9 (shown by the dotted line in FIG. 1). Using photoresist mask 9, the undesired portions of silicon nitride layer 8 and pad oxide layer 4 are then removed by any suitable anisotropic etching process to obtain silicon nitride layer 8a and pad oxide layer 4a. Photoresist mask 9 may then be removed by any suitable process known in the art which does not attack silicon nitride layer 8a or substrate 2.

Next, as depicted in FIG. 2, at least one isolation region (illustratively represented as isolation region 10) is formed in substrate 2 by any suitable process known in the art. For example, field isolation region 10 may be formed by any suitable process employing silicon nitride layer 8a as a mask, such as a trench-and-refill or local oxidation of silicon (LOCOS) process. Preferably, as illustrated in FIG. 2, isolation regions 10 are field oxide regions formed by a LOCOS process, which oxidizes the surface of preferred silicon substrate 2 in areas where silicon nitride layer 8 and pad oxide layer 4 have been removed to form recessed oxide regions due to the consumption of silicon. The thickness of isolation regions 10 may range from about 2000 to about 4000 angstroms. After forming isolation regions 10, silicon nitride layer 8a and pad oxide layer 4a are removed to expose substrate 2 by any suitable process known in the art which does not attack substrate 2 and minimizes attack of field isolation regions 10. Preferably, when isolation regions 10 comprise silicon oxide, silicon nitride layer 8a and pad oxide layer 4a are removed by a wet etch process using phosphoric acid and/or hydrofluoric acid.

Figure 3:
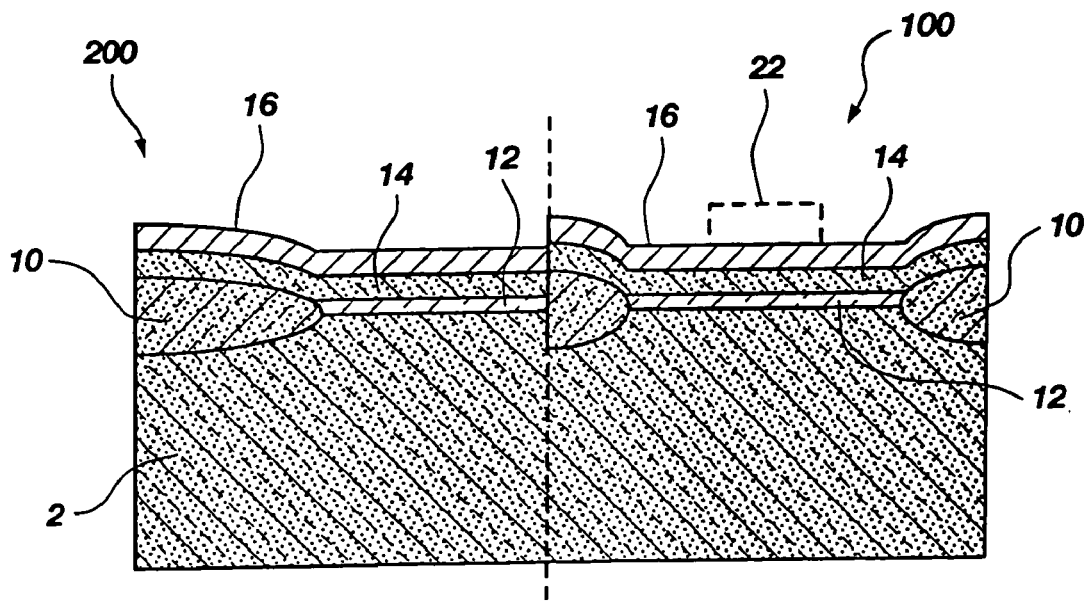

Next, as depicted in FIG. 3, dielectric layer 12 is formed over substrate 2 and optionally over isolation regions 10. Any dielectric material suitable as a gate dielectric, such as doped or undoped silicon oxide, organic dielectric materials, boron and/or phosphorous doped silicate glass, silicon oxynitride, or silicon nitride, or a composite layer of these materials, can be used as dielectric layer 12. Preferably, dielectric layer 12 is a silicon oxide layer formed by thermally oxidizing the preferred silicon substrate 2 to form a high-quality silicon oxide layer with little to no contamination. The preferred silicon oxide layer is formed primarily over the exposed regions of substrate 2, but may be formed over isolation regions 10 if the silicon oxide layer is deposited rather than thermally grown. The thickness of dielectric layer 12 may range from about 50 to about 150 angstroms.

Next, polysilicon layer 14 is formed over dielectric layer 12 and field isolation regions 10. Polysilicon layer 14 may be formed by any suitable deposition method known in the art, such as physical or chemical vapor deposition. Preferably, polysilicon layer 14 is deposited by low-pressure CVD to a thickness ranging from about 800 to about 2000 angstroms. Polysilicon layer 14 is then doped, preferably with an n-type dopant, such as phosphorous, by any suitable ion implantation or doping process known in the art. Alternatively, polysilicon layer 14 can be in-situ doped during deposition of polysilicon layer 14 by including a gas containing the desired dopant in the deposition atmosphere.

Next, conductive layer 16 is formed over polysilicon layer 14 by any suitable process known in the art. Conductive layer 16 may comprise any conductive material that has a lower resistance and/or a lower melting point than polysilicon layer 14, such as titanium silicide, polycide, or tungsten silicide. Preferably, tungsten silicide is employed as conductive layer 16. When tungsten silicide is employed as conductive layer 16, the tungsten silicide layer may be formed by any process yielding the desired physical and chemical characteristics, such as CVD or co-sputtering. Preferably, this tungsten silicide layer is formed by CVD using tungsten hexafluoride ($WF_6$) and silane ($SH_4$) at a temperature ranging from about 400 to about 500° C. until a thickness of about 600 to about 1500 angstroms is obtained.

Figure 4:
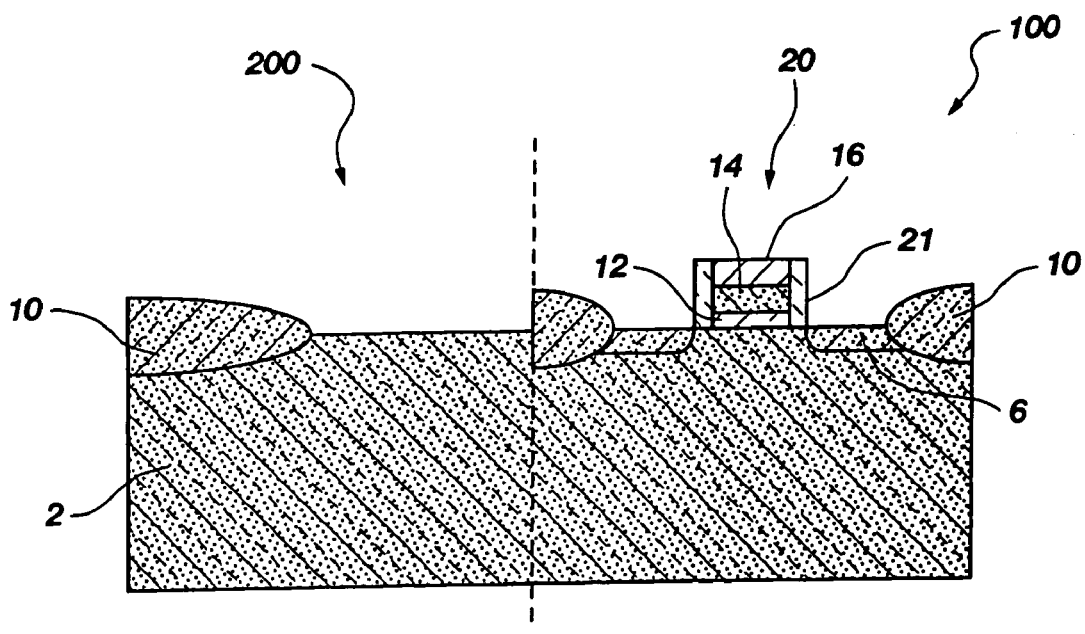

Next, as depicted in FIG. 4, conductive layer 16, polysilicon layer 14, and dielectric layer 12 are patterned by any suitable process known in the art to form at least one gate structure (illustratively represented as gate structure 20). Gate structure 20 may be formed by any suitable patterning process, such as a photolithographic pattern and etch process. For example, a photoresist film can be spun on conductive layer 16, developed, and portions thereof removed to leave photoresist mask 22 (shown by the dotted line in FIG. 3). Using photoresist mask 22, portions of conductive layer 16, polysilicon layer 14, and dielectric layer 12 not underlying photoresist mask 22 are removed by any suitable anisotropic etching process known in the art to obtain gate structure 20.

If desired, sidewall spacers 21 for gate structure 20 can then be formed by any suitable process known in the art, such as depositing a dielectric layer overall and etching anisotropically to leave substantially vertical sidewall spacers 21. At least one diffusion region (illustrated as diffusion region 6), such as source/drain regions, can then be formed in substrate 2 by any suitable process known in the art, such as implanting a suitable dopant at an energy and dose sufficient to form the desired dopant concentration. For example, arsenic could be implanted at about 20 keV to about 80 keV to obtain a concentration of about $1 \times 10^{20}$ to about $5 \times 10^{20}$ atom/cm$^3$.

Figure 5:
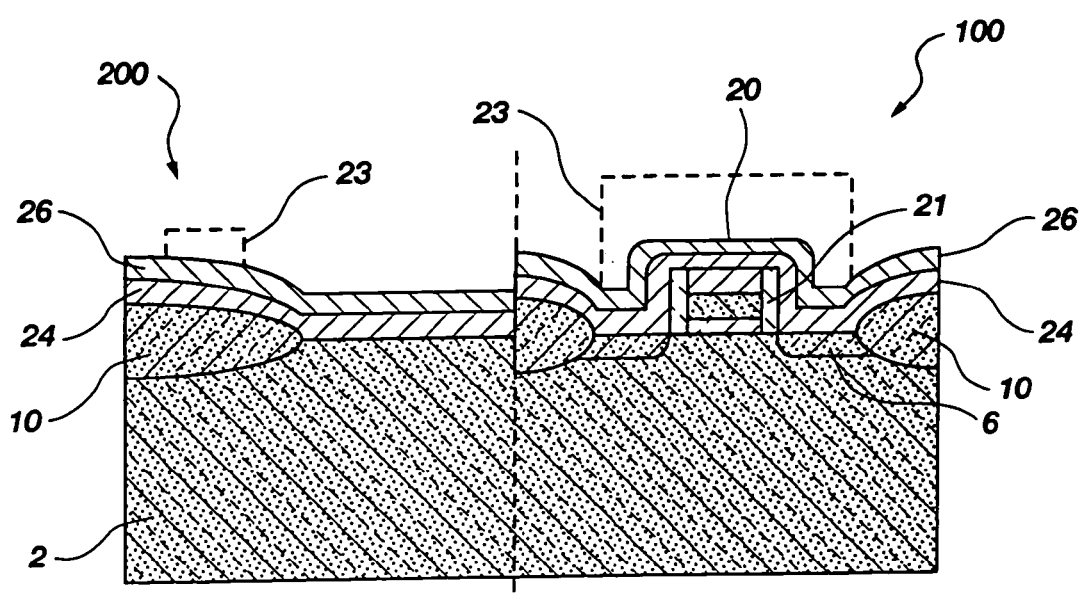

Referring to FIG. 5, a layer comprising titanium (Ti) (hereafter the "Ti layer") is then deposited or otherwise formed over substrate 2, isolation regions 10, and gate structure 20. The Ti layer may be formed by any process imparting the desired physical and chemical characteristics to the layer. Preferably, the Ti layer is formed by a sputter deposition process, such as sputter deposition using a Ti target in a vacuum containing argon, to a thickness ranging from about 200 to about 500 Å, and more preferably 300 Å. The Ti layer may be a titanium compound or titanium alloy since the layer need not be, but preferably is, substantially pure titanium. For example, alloying elements or other metals may be introduced into the Ti layer to provide better physical and chemical properties.

The Ti layer is then converted to a layer comprising titanium and nitrogen, such as $Ti_xN_y$ where x can range from more than 0 to less than 1.0 (hereafter "titanium nitride (or TiN) layer 24"). In one embodiment, this conversion is performed by annealing the Ti layer in a nitrogen-containing atmosphere for a time and temperature sufficient to convert the titanium to a mixture of titanium and nitrogen. In this annealing process, the temperature may range from about 600 to about 750° C., and is preferably about 650° C., and the time may range from about 20 to about 120 seconds, and is preferably about 60 seconds. The nitrogen-containing atmosphere of the annealing process may comprise a gas or a mixture of gases containing nitrogen, such as nitrogen, ammonia, or mixtures thereof. The annealing atmosphere may also contain other gases, such as argon or hydrogen. Preferably, the nitrogen-containing atmosphere contains substantially pure nitrogen gas.

TiN layer 24 may also be formed by an alternative process. In this process, TiN layer 24 is formed in a single step by depositing Ti over substrate 2, isolation regions 10, and gate structure 20 in an atmosphere comprising N. Preferably, during this single step process, the Ti is deposited by any suitable deposition process, such as sputter deposition using a Ti target in a vacuum containing Ar and N. TiN layer 24 need not be pure titanium nitride. The concentration of nitrogen in TiN layer 24 can be controlled by controlling the nitrogen concentration in the gas or gases comprising the sputtering atmosphere. For example, the concentration of nitrogen in TiN layer 24 may range from about 2% to about 80%, and preferably about 10%.

As shown in FIG. 5, conductive layer 26 is then deposited or otherwise formed on TiN layer 24. Conductive layer 26 may comprise any conductive material known in the art, such as a metal, metal alloy, or metal compound. Conductive layer 26 preferably comprises tungsten silicide. Conductive layer 26 may be formed by any suitable process known in the art which imparts the necessary physical and chemical characteristics to the layer, such as a suitable CVD process. Preferably, conductive layer 26 is formed by a CVD process to a thickness ranging from about 200 to about 1200 Å, and more specifically about 600 Å.

Next, conductive layer 26 is patterned in the desired fuse pattern. This patterning can be performed by any suitable process known in the art, such as a photolithographic pattern and etch process. For example, a photoresist film can be spun on conductive layer 26, developed, and portions thereof removed to leave photoresist mask 23 (shown by the dotted line in FIG. 5). Using photoresist mask 23, portions of conductive layer 26 not underlying photoresist mask 23 are removed by any suitable anisotropic etching process known in the art.

Figure 7:
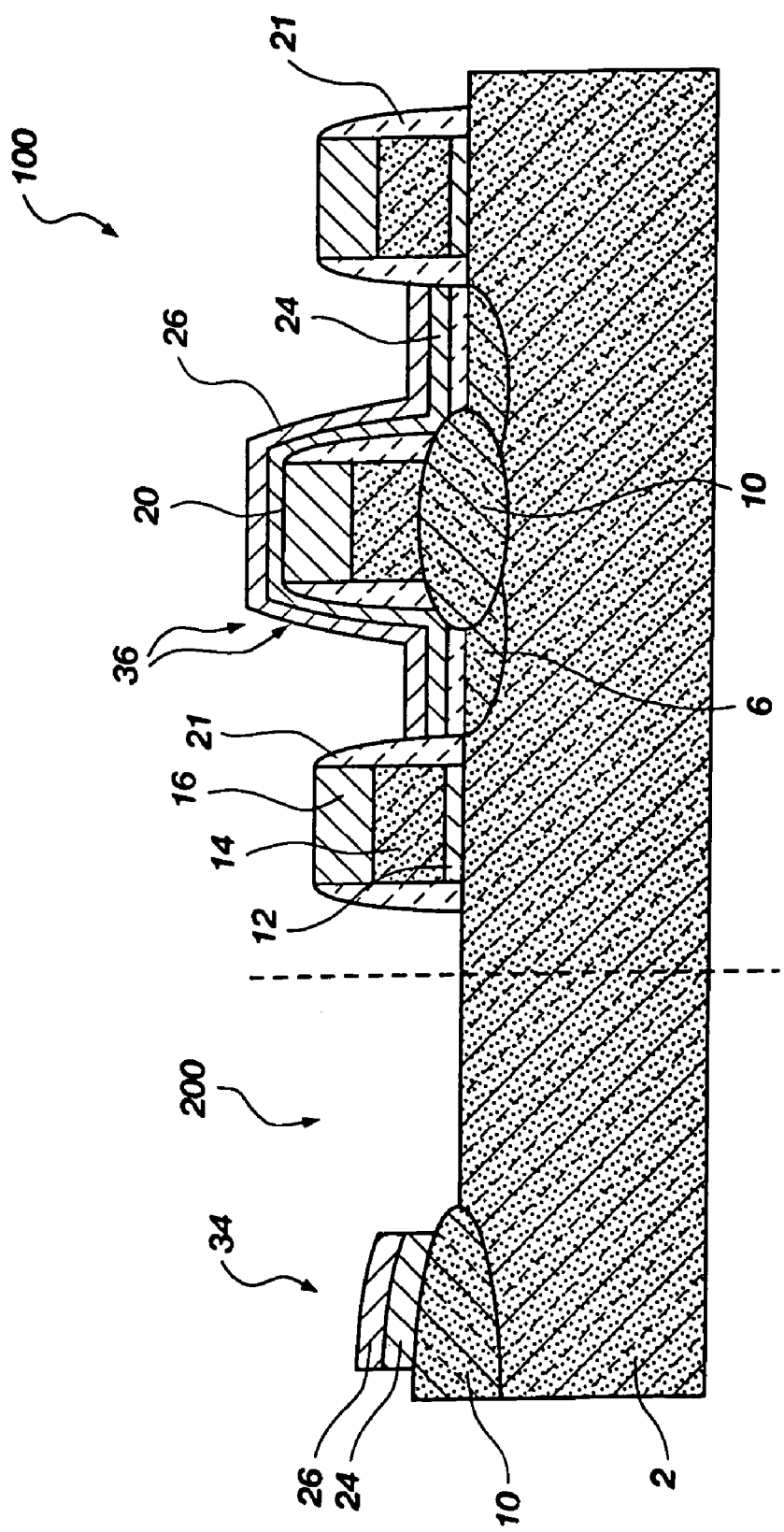

Removing portions of conductive layer 26 will expose underlying portions of TiN layer 24, which are then also removed. Any suitable process which removes portions of TiN layer 24 without removing or adversely affecting the rest of the underlying device can be employed. Preferably, a wet etch solution is employed. More preferably, a wet etch solution containing about 5 parts $H_2O$, about 0.25 to about 1 part $H_2O_2$, and about 0.25 to about 1 part $NH_4OH$ is used to remove the desired portions of TiN layer 24. After removal of the underlying portions of TiN layer 24, the structure of the IC containing the fuse and local interconnect (LI) is depicted in FIG. 7.

Figure 6:
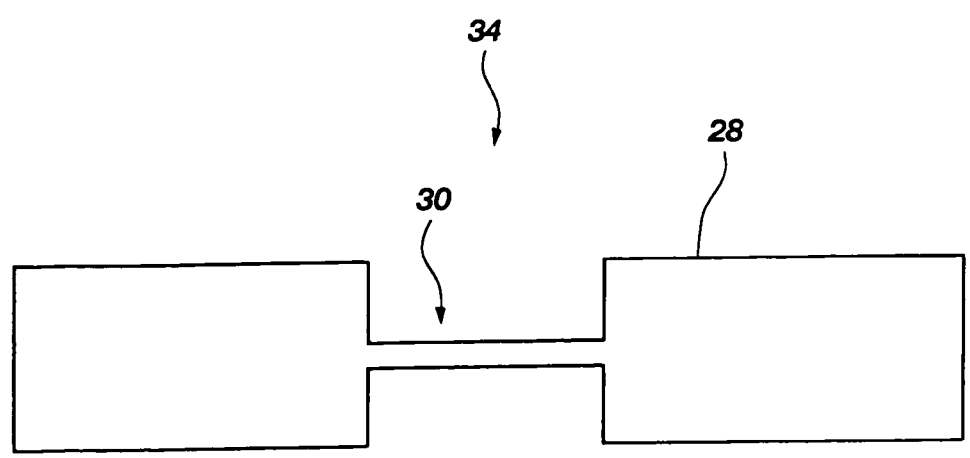
FIG. 6 is a cross-sectional top view of a fuse element according to the present invention.

This process of patterning conductive layer 26 and TiN layer 24 should be performed to obtain the desired LI structure 36 and to obtain the desired structure of fuse 34. One preferred structure of an LI structure 36 is illustrated in FIG. 7, where an LI structure 36 has been fabricated to overlie gate structure 20 overlying isolation region 10. One preferred structure for fuse 34 is illustrated in FIGS. 6 and 7, where the fuse structure is disposed over isolation region 10 and contains at least two distinct regions: terminal portions or regions 28 and neck region or portion 30. Terminal regions 28 are patterned to accommodate metal contacts that will later be formed thereon. Thus, the size and shape of terminal regions 28 will vary depending on the number and types of metal contacts to be formed thereon. The pattern (e.g., length and width) of neck portion 30 depends on the desired fuse properties. Preferably, the length of neck portion 30 may range from about 1 to about 20 microns, and more preferably is about 3.5 microns. Preferably, the width of neck portion 30 may range from about 0.2 to about 1 micron, and more preferably is about 0.35 microns.

Neck portion 30 is that portion of fuse 34 that will blow when subjected to programming or sufficient electrical current. For the preferred dimensions of neck portion 30 above, when a sufficient amount of current, about 1 to about 25 mA and preferably about 5.5 mA, flows through conductive layer 26, it heats up and melts in neck portion 30, thereby interrupting the current flow. Neck portion 30 blows before terminal portions 28 because, while the same amount of current runs through both, there is less area in neck portion 30. Consequently, the temperature of neck portion 30 is higher than the temperature in terminal portions 28, leading to quicker melting of conductive layer 26 in this region. Reducing the width-to-length ratio of neck portion 30 and changing the material of conductive layer 26 will change the amount of current needed to blow the fuse 34. Tungsten silicide is the preferred material for conductive layer 26 since, when practiced in the present invention, the tungsten silicide requires only about half the electrical current to blow as a polysilicon fuse with similar dimensions. After the fuse is blown by this electrical current, the leakage current of the blown fuse ranges from about 1 to about 10 nA and is preferably less than about 1 nA.

Further processing of the IC can then proceed. An optional high temperature anneal may be performed to reduce the local interconnect sheet resistivity. This high temperature anneal may be performed at 750–875° C. for about 15 to about 60 minutes in an argon atmosphere. Metal contacts could then be formed to terminal regions 28 of fuse 34 by any suitable process known in the art.

Further enhancements to the above disclosed method are possible. For example, a dielectric layer could be formed over conductive layer 26 in gate structure 20, if desired. Also, the fuse of the present invention could be fabricated simultaneously with devices other than local interconnects.

Having thus described in detail the preferred embodiments of the present invention, it is to be understood that the invention defined by the appended claims is not to be limited by particular details set forth in the above description, as many apparent variations thereof are possible without departing from the spirit or scope thereof.

What is claimed is:

1. A method of using a fuse in an integrated circuit, comprising:

providing a fuse including a conductive layer overlying a refractory metal nitride layer disposed above an insulating substrate and having a neck portion extending between terminal portions, the neck portion having a width of about 0.35 micron; and applying electrical current between the terminal portions sufficient to blow the fuse by causing the neck portion of the fuse to melt and produce a leakage current of the blown fuse of about 1 nA.

2. The method of claim 1, including providing the neck portion with a length of about 3.5 microns.

3. The method of claim 1, including applying the electrical current within a range of about 1 to about 25 mA.

4. The method of claim 1, including applying the electrical current of about 5.5 mA.

5. The method of claim 1, wherein providing the fuse including the conductive layer comprises providing a fuse including a tungsten silicide layer.

6. The method of claim 1, wherein providing the fuse including the conductive layer overlying a refractory metal nitride layer comprises providing a fuse including a conductive layer overlying a titanium nitride layer.

7. The method of claim 1, wherein providing the fuse including the conductive layer comprises forming a tungsten silicide layer by chemical vapor deposition.

8. A method of using a fuse in an integrated circuit, comprising:

providing a fuse including a conductive layer overlying a refractory metal nitride layer disposed above an insulating substrate and having a neck portion extending between terminal portions, the neck portion being smaller in width than the terminal portions; and applying electrical current within a range of about 1 to about 25 mA between the terminal portions sufficient to blow the fuse by causing the neck portion of the fuse to melt and produce a leakage current of the blown fuse of about 1 nA.

9. The method of claim 8, wherein providing the fuse comprises providing the neck portion with a length of about 3.5 microns.

10. The method of claim 8, wherein providing the fuse comprises providing the neck portion with a width of about 0.35 micron.

11. The method of claim 8, wherein applying the electrical current comprises applying electrical current of about 5.5 mA.

12. The method of claim 8, wherein providing the fuse including the conductive layer overlying the refractory metal nitride layer comprises providing a fuse including a tungsten silicide layer overlying the refractory metal nitride layer.

13. The method of claim 8, wherein providing the fuse including the conductive layer overlying the refractory metal nitride layer comprises providing a fuse including a conductive layer overlying a titanium nitride layer.

14. The method of claim 8, wherein providing the fuse including the conductive layer overlying the refractory metal nitride layer comprises forming a tungsten silicide layer by chemical vapor deposition over the refractory metal nitride layer.

15. A method of using a fuse in an integrated circuit, comprising:

providing a fuse including a conductive layer overlying a refractory metal nitride layer disposed above an insulating substrate, the fuse including a neck portion extending between terminal portions, the neck portion having a first width smaller than a second width of the terminal portions; and melting the neck portion of the fuse by flowing electrical current between the terminal portions to produce a leakage current of the blown fuse of about 1 nA.

16. The method of claim 15, wherein melting the neck portion comprises applying the electrical current within a range of about 1 to about 25 mA between the terminal portions.

17. The method of claim 15, wherein melting the neck portion comprises applying the electrical current of about 5.5 mA between the terminal portions.

18. The method of claim 15, wherein providing the fuse including the conductive layer overlying the refractory metal nitride layer comprises providing a fuse including a tungsten suicide layer overlying the refractory metal nitride layer.

19. The method of claim 15, wherein providing the fuse including the conductive layer overlying the refractory metal nitride layer comprises providing a fuse including a conductive layer overlying a titanium nitride layer.

* * * * *

UNITED STATES PATENT AND TRADEMARK OFFICE
CERTIFICATE OF CORRECTION

| | | |
|---|---|---|
| PATENT NO. | : 7,109,105 B2 | Page 1 of 1 |
| APPLICATION NO. | : 10/838587 | |
| DATED | : September 19, 2006 | |
| INVENTOR(S) | : Wang et al. | |

It is certified that error appears in the above-identified patent and that said Letters Patent is hereby corrected as shown below:

In column 10, line 7, in Claim 18, delete "suicide" and insert -- silicide --, therefor.

Signed and Sealed this

First Day of April, 2008

JON W. DUDAS
*Director of the United States Patent and Trademark Office*